United States Patent
Windisch et al.

(10) Patent No.: US 7,932,526 B2
(45) Date of Patent: Apr. 26, 2011

(54) LED SEMICONDUCTOR BODY AND USE OF AN LED SEMICONDUCTOR BODY

(75) Inventors: Reiner Windisch, Pettendorf (DE); Günther Grönninger, Seubersdorf (DE); Peter Heidborn, Zeitlarn (DE); Christian Jung, Pielenhofen (DE); Walter Wegleiter, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 9 days.

(21) Appl. No.: 12/087,293

(22) PCT Filed: Dec. 13, 2006

(86) PCT No.: PCT/DE2006/002228
§ 371 (c)(1), (2), (4) Date: Nov. 24, 2008

(87) PCT Pub. No.: WO2007/076796
PCT Pub. Date: Jul. 12, 2007

(65) Prior Publication Data
US 2009/0173961 A1 Jul. 9, 2009

(30) Foreign Application Priority Data

Dec. 30, 2005 (DE) .......................... 10 2005 063 105
Aug. 22, 2006 (DE) .......................... 10 2006 039 369

(51) Int. Cl.
*H01L 33/00* (2010.01)
(52) U.S. Cl. ....... 257/97; 257/94; 257/96; 257/E33.002; 257/E33.012

(58) Field of Classification Search .................. 257/94, 257/96, 97, E33.002, E33.012
See application file for complete search history.

(56) References Cited

U.S. PATENT DOCUMENTS

| | | |
|---|---|---|
| 6,620,643 B1 | 9/2003 | Koike |
| 2002/0139987 A1 | 10/2002 | Collins, III et al. |
| 2004/0090779 A1 | 5/2004 | Ou et al. |
| 2005/0067627 A1* | 3/2005 | Shen et al. ................ 257/89 |
| 2005/0189551 A1* | 9/2005 | Peng et al. ................ 257/94 |
| 2005/0205884 A1* | 9/2005 | Kim et al. ................ 257/98 |
| 2005/0266588 A1 | 12/2005 | Stauss |
| 2007/0158659 A1 | 7/2007 | Bensce |

FOREIGN PATENT DOCUMENTS

| | | |
|---|---|---|
| CN | 1490888 | 4/2004 |
| DE | 102 13 464 | 10/2002 |
| DE | 10 2004 004 765 | 9/2005 |
| DE | 10 2004 015 570 | 11/2005 |
| DE | 10 2004 026 125 | 12/2005 |
| EP | 1 403 935 | 9/2003 |
| EP | 1 475 835 | 11/2004 |
| EP | 1 605 561 | 12/2005 |
| WO | WO 2005/073485 | 8/2005 |

OTHER PUBLICATIONS

I. Schnitzer et al., "30% external quantum efficiency from surface textured, thin-film ligh-emitting diodes", Applied Physics Letters, vol. 63, No. 16, pp. 2174-2176, Oct. 18, 1993.

* cited by examiner

*Primary Examiner* — Victor Mandala
(74) *Attorney, Agent, or Firm* — Cohen Pontani Lieberman & Pavane LLP

(57) ABSTRACT

An LED semiconductor body comprising a first radiation-generating active layer and a second radiation-generating active layer, the first active layer and the second active layer being arranged one above another in the vertical direction.

21 Claims, 2 Drawing Sheets

LED SEMICONDUCTOR BODY AND USE OF AN LED SEMICONDUCTOR BODY

RELATED APPLICATIONS

This is a U.S. national stage under 35 USC 371 of application No. PCT/DE2006/002228 filed on 13 Dec. 2006.

This patent application claims the priority of German Patent Application no. 10 2005 063 105.3 filed Dec. 30, 2005 and also of German Patent Application no. 10 2006 039 369.4 filed Aug. 22, 2006 the entire content of both of which is hereby incorporated by reference.

FIELD OF THE INVENTION

The present invention relates to an LED semiconductor body and to uses of an LED semiconductor body.

BACKGROUND OF THE INVENTION

Conventional LED semiconductor bodies generally have a layer structure with a pn junction. The active layer of the LED, in which the generation of radiation takes place during operation, is situated in the region of said pn junction. The quantity of radiation generated depends on the current intensity with which the LED semiconductor body is operated.

However, the current density in the active layer should not exceed a maximum current density, which is dependent on the material system respectively used, since otherwise there is the risk of excessive aging effects disadvantageously shortening the lifetime of the LED semiconductor body.

SUMMARY OF THE INVENTION

It is an object of the present invention to provide an LED semiconductor body having an increased radiation density.

This and other objects are attained in accordance with one aspect of the invention directed to an LED semiconductor body comprising a first radiation-generating active layer and a second radiation-generating active layer, the first active layer and the second active layer being arranged one above another in the vertical direction.

In the present case, an active layer is understood to be a radiation-generating pn junction. In the simplest case, said pn junction may be formed by means of a p-conducting semiconductor layer and an n-conducting semiconductor layer which directly adjoin one another. The actual radiation-generating layer, for instance in the form of a doped or undoped quantum layer, is preferably formed between the p-conducting and the n-conducting active layer. The quantum layer may be formed as a single quantum well structure (SQW) or multiple quantum well structure (MQW) or else as a quantum wire or quantum dot structure.

In an advantageous manner, in the case of an LED semiconductor body comprising active layers arranged one above another, in comparison with conventional LED semiconductor bodies of the type mentioned in the introduction, two or else more active layers are simultaneously available for generating radiation, so that the quantity of radiation generated overall or the radiation density is advantageously increased.

In comparison with another possibility for increasing the quantity of radiation, namely enlarging the cross-sectional area of the semiconductor body in a lateral direction, an LED semiconductor body comprising pn junctions stacked one above another is distinguished by an advantageously reduced production outlay and hence also by lower production costs per LED semiconductor body. By contrast, enlarging the cross-sectional area of the semiconductor body may lead to significantly higher costs per LED semiconductor body.

Furthermore, an LED semiconductor body comprising active layers arranged vertically one above another can be adapted in a simplified manner to a predetermined supply voltage such as, for example, 12 V or 24 V. With the pn junctions of the active layers being strung together in the same orientation, the voltage drops at the active layers are cumulated during operation, so that the LED semiconductor body can be adapted to a predetermined supply voltage, for example 12V or 24 V, by way of the number of active layers.

Preferably, the first and the second active layer are monolithically integrated into the semiconductor body. This obviates the production step of connecting the first layer stack to the second layer stack, for example by means of bonding.

In the present case, an LED semiconductor body means a semiconductor body for a light-emitting diode, that is to say a semiconductor component that emits incoherent radiation, in particular the first and the second active layer in each case generating incoherent radiation.

In a first variant of the LED semiconductor body, the first and the second active layer emit radiation having a similar wavelength. In an advantageous manner, the quantity of radiation and, in particular, the radiation density for a predetermined wavelength are thus advantageously increased in comparison with conventional LED semiconductor bodies.

In a second variant of the LED semiconductor body, the first and the second active layer generate radiation having different wavelengths. This variant has the advantage that the emission spectrum of the LED semiconductor body is widened overall. This is advantageous in particular for generating mixed-colour light, preferably white light.

In an advantageous development of the LED semiconductor body, a tunnel junction is formed between the first active layer and the second active layer. Said tunnel junction serves as an electrical connection between the first and second active layer. By way of example, such a tunnel junction may be formed by means of a highly doped layer of a first conductivity type and a highly doped layer of a second conductivity type. It should be noted that the semiconductor layers need not necessarily be doped homogeneously since a high doping at the interface with the respective other semiconductor layer may already suffice for forming a tunnel junction.

Preferably, in this development, the first and the second active layer are arranged in the same orientation, with the result that their pn junctions therefore form a pn-pn or np-np structure, the pn junctions being electrically connected in series by means of the intervening tunnel junction. In the context of the present invention, it is also possible, in a similar manner, to arrange three or more active layers in an LED semiconductor body vertically one above another, which are connected in a corresponding manner by a respective tunnel junction formed between two adjacent active layers.

Furthermore, it is possible for the tunnel junction to be formed from a first conductive layer of the first conductivity type and a second conductive layer of a second conductivity type, an interlayer being arranged between the first layer and the second layer, which interlayer may be undoped or lightly doped with the first or second conductivity type.

Moreover, it is conceivable for two interlayers to be arranged between the first layer and the second layer, the interlayer adjoining the first layer having the same conductivity type as the first layer, and the interlayer adjoining the second layer having the same conductivity type as the second layer.

In a further embodiment of the LED semiconductor body, a connecting layer of a first conductivity type is arranged between the first and the second active layer, and a layer of a second conductivity type in each case is arranged on that side of the first and of the second active layer which is remote from the connecting layer.

In this variant, the pn junctions of the first and of the second active layer are formed in opposite orientations with respect to one another, with the result that a pn-np or np-pn structure therefore arises, it being possible for the two pn junctions to be connected by means of an n-conducting or p-conducting connecting layer, respectively. In an advantageous manner, the forward voltage remains unchanged in comparison with a conventional LED by means of a parallel connection.

The connecting layer is preferably arranged and formed in such a way that it is electrically connectable by means of a contact. For electrically connecting the first and the second active layer in parallel, the outer layers of the second conductivity type may be electrically connected by means of a preferably external contact-connection, that is to say contact-connection arranged outside the semiconductor body.

The LED semiconductor body is expediently arranged on a carrier element. An electrically conductive carrier element is preferably used for this purpose. This makes it possible to form a vertically conductive component in which the current flow runs essentially in the vertical direction. Components of this type are distinguished by a comparatively homogeneous current distribution within the LED semiconductor body. For contact-connection, a rear side contact is expediently arranged on a side of the conductive carrier element which is remote from the LED semiconductor body.

As an alternative or in addition, the carrier element may be transmissive to the radiation generated, with the result that radiation can be coupled out through the substrate.

The LED semiconductor body may be grown epitaxially on the carrier element. The growth substrate then also serves as a carrier element. The known and established epitaxy techniques, for example for the AlGaAs or InAlGaAs material system, may be used for the epitaxial growth.

As an alternative, the LED semiconductor body is mounted on a carrier element that is different from the growth substrate, the growth substrate preferably having been removed from the semiconductor body. The semiconductor body may then also be referred to as a thin-film semiconductor body.

A thin-film semiconductor body is distinguished, in particular, by at least one of the following characteristic features:
  a reflective layer is applied or formed at a first main area of a radiation-generating epitaxial layer sequence facing toward a carrier element, said reflective layer reflecting at least one portion of the electromagnetic radiation generated in the epitaxial layer sequence back into the latter;
  the epitaxial layer sequence has a thickness in the region of 20 μm or less, in particular in the region of 10 μm; and
  the epitaxial layer sequence contains at least one semiconductor layer having at least one area having an intermixing structure which ideally leads to an approximately ergodic distribution of the light in the epitaxial layer sequence, that is to say that it has an as far as possible ergodically stochastic scattering behaviour.

A basic principle of a thin-film light-emitting diode chip is described for example in I. Schnitzer et al., Appl. Phys. Lett. 63 (16), 18 Oct. 1993, 2174-2176, the disclosure content of which in this respect is hereby incorporated by reference.

A thin-film light-emitting diode chip is to a good approximation a Lambert surface radiator and is suitable in particular for application in a headlight.

In the case of the LED semiconductor body formed as a thin-film semiconductor body, the intensity of coupled-out radiation is advantageously increased.

Depending on the material system, the growth substrate may be removed mechanically, thermally or by means of a laser lift-off method. Thin-film semiconductor bodies are distinguished by an advantageously low forward voltage and a high efficiency in the generation of radiation. Furthermore, thin-film semiconductor bodies are not limited by the boundary conditions required for epitaxy with regard to the selection of the carrier element, so that the carrier elements can be optimized for example with regard to their thermal conductivity or else their costs. Thin-film semiconductor bodies of the abovementioned type are suitable in particular for the InGaAlP or InGaAlN material system.

What are suitable as semiconductor material for the LED semiconductor body and, if appropriate, for a carrier element on which the semiconductor body is arranged are, by way of example, InAlGaAs ($Al_nGa_mIn_{1-n-m}As$ where $0 \leq n \leq 1$, $0 \leq m \leq 1$ and $n+m \leq 1$), InGaAlP ($Al_nGa_mIn_{1-n-m}P$ where $0 \leq n \leq 1$, $0 \leq m \leq 1$ and $n+m \leq 1$), and/or InGaAlN ($Al_nGa_mIn_{1-n-m}N$ where $0 \leq n \leq 1$, $0 \leq m \leq 1$ and $n+m \leq 1$), the respective binary and ternary compounds such as, for example, GaAs, AlGaAs, GaP, InP, GaAlP, GaN or InGaN being included.

In this case, the respective material need not necessarily have a mathematically exact composition according to the above formula. Rather, it may have one or more dopants and also additional constituents which essentially do not change the physical properties of the material. For the sake of simplicity, however, the above formula comprises only the essential constituents of the crystal lattice (Al, Ga, In, P), even though these may be replaced in part by small quantities of further substances.

The LED semiconductor body preferably emits radiation in the vertical direction during operation, the radiation emitted by the first and second active layers typically being intermixed.

An LED semiconductor body comprising active layers arranged one above another may be used for general lighting. A semiconductor body of this type is particularly suitable for this due to the increased radiation density.

Furthermore, the LED semiconductor body may be used for backlighting, for example of displays.

The LED semiconductor body is preferably used for projection applications.

DETAILED DESCRIPTION OF THE INVENTION

Identical or identically acting elements are provided with the same reference symbols in the figures.

Figure 1:
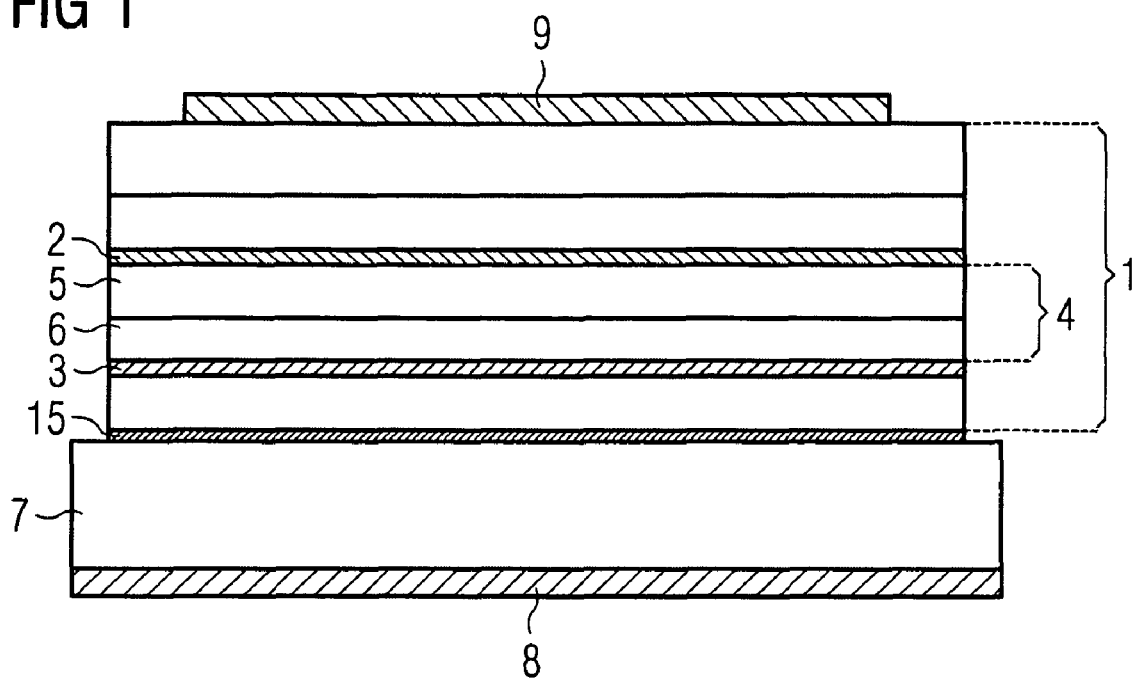
FIG. 1 shows a schematic sectional view of a first exemplary embodiment of an LED semiconductor body according to the invention.

The LED semiconductor body 1 of a first exemplary embodiment as illustrated in FIG. 1 has a first radiation-generating active layer 2 and a second radiation-generating active layer 3, the active layers being arranged one above another in vertical direction, that is to say perpendicular to a main direction of extent of the active layers. A tunnel junction 4 is formed between the active layers 2, 3, said tunnel junction being formed by means of a first semiconductor layer 5 of a first conductivity type, for example an n-conducting semiconductor layer, and a second semiconductor layer 6 of a second conductivity type, for example a p-conducting semiconductor layer. These two semiconductor layers 5, 6 are preferably embodied in highly doped fashion, thus giving rise to an efficient tunnel junction having a low electrical junction resistance during operation.

The arrangement of two active layers in an LED semiconductor body advantageously increases the quantity of radiation generated overall. Since the dimensions of the LED semiconductor body change only insignificantly in comparison with an LED semiconductor body comprising only a single active layer and, in particular, the cross section of the LED semiconductor body is independent of the number of active layers, more extensively the radiation density is also advantageously increased.

The semiconductor body 1 is arranged on a carrier element 7. A surface of the semiconductor body 1 which faces the carrier element 7 is preferably provided with a reflective layer 15. Particularly preferably, both the reflective layer 15 and the carrier element 7 are electrically conductive. More extensively, the carrier element 7 is provided with a rear side contact 8 on a side remote from the semiconductor body 1. A front side contact 9 is correspondingly formed on a side of the LED semiconductor body 1 opposite to the carrier element 7. A vertically conductive component distinguished by a comparatively homogeneous current distribution within the LED semiconductor body is thus formed.

The LED semiconductor body 1 is grown on a separate growth substrate and subsequently mounted onto the carrier element, for example by means of soldering, bonding or adhesive bonding, the growth substrate preferably being stripped away from the LED semiconductor body. The reflective layer 15 may be formed for example as a Bragg mirror, a metallic layer, a TCO layer (transparent conductive oxide) such as, for example, an ITO or ZnO layer or a composite of a metallic layer and a TCO layer. Parts of radiation that are emitted in the direction of the carrier element 7 can thus be reflected back in the direction of the radiation coupling-out side.

On the radiation coupling-out side, the LED semiconductor body, for increasing the radiation efficiency, may be provided with a roughness, surface structuring, for instance in the form of microprisms, or some other means for reducing (total) reflection losses at the radiation coupling-out area.

Figure 2:
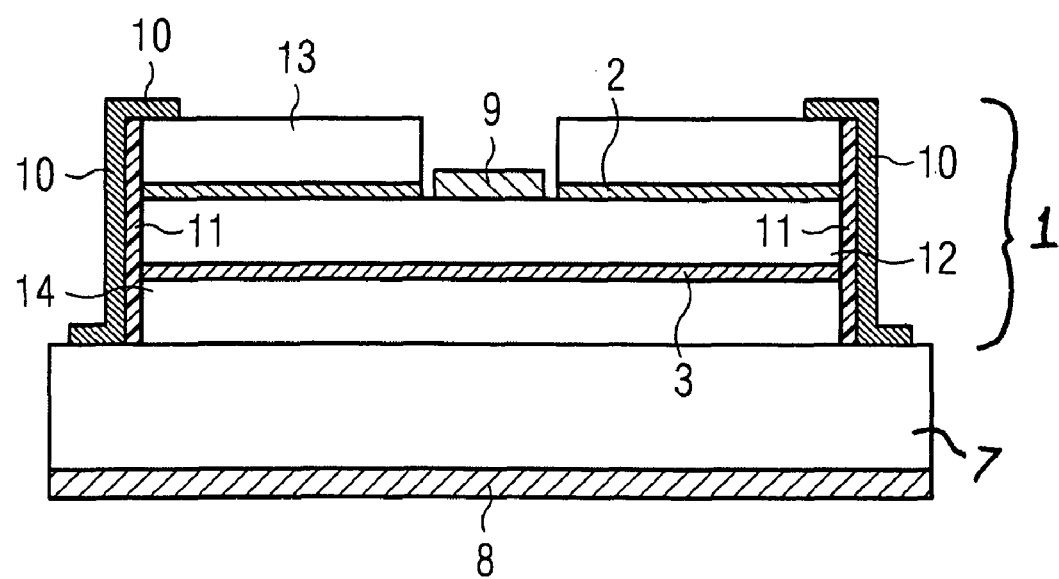
FIG. 2 shows a schematic sectional view of a second exemplary embodiment of an LED semiconductor body according to the invention.

The exemplary embodiment illustrated in FIG. 2 shows an LED semiconductor body 1 which, like the exemplary embodiment in accordance with FIG. 1, has a first radiation-generating active layer 2 and a second radiation-generating active layer 3 and is arranged on a carrier element 7 provided with a rear side contact 8.

In contrast to the exemplary embodiment in accordance with FIG. 1, a connecting layer 12 of a first conductivity type, for example a p-conducting semiconductor layer, is arranged between the first active layer 2 and the second active layer 3. The formation of a tunnel junction is not absolutely necessary in this case. Semiconductor layers 13, 14 of a second conductivity type, for example an n-conducting semiconductor layer, are respectively formed on that side of the first active layer 2 and of the second active layer 3 which is remote from said connecting layer 12. In contrast to the exemplary embodiment in accordance with FIG. 1, in the case of the LED semiconductor body in accordance with FIG. 2, the pn junctions of the active layers 2 and 3 are thus arranged in opposite directions, with the result that an np-pn structure arises.

It goes without saying that all conductivity types can be interchanged with one another in the context of the invention, so that, by way of example, in the exemplary embodiment in accordance with FIG. 2, the connecting layer 12 is n-conducting and the outer layers 13, 14 are p-conducting and a pn-np structure thus arises.

For contact-connection, a cavity reaching as far as the connecting layer 12 is formed in the top-side semiconductor layer 13 of the second conductivity type, for example the n-conducting semiconductor layer. A front side contact 9 is arranged within said cavity, via which contact the connecting layer 12 is electrically connectable.

The—with respect to the connecting layer 12—outer semiconductor layers 13, 14 of the second conductivity type are electrically conductively connected to one another and to the rear side contact 8 via an external connection 10, for example a metallization or an electrically conductive TCO coating, and the carrier element 7.

An insulating layer 11 is provided between the external connection 10 and the semiconductor body 1. This makes it possible to prevent the external connection 10 from electrically short-circuiting the active layers 2 and 3.

The semiconductor body 1 is grown onto the carrier element 7.

On the radiation coupling-out side, the LED semiconductor body, for increasing the radiation efficiency, may once again be provided with a roughness, a surface structuring, for instance in the form of microprisms, or some other means for reducing (total) reflection losses at the radiation coupling-out area.

Figure 3:
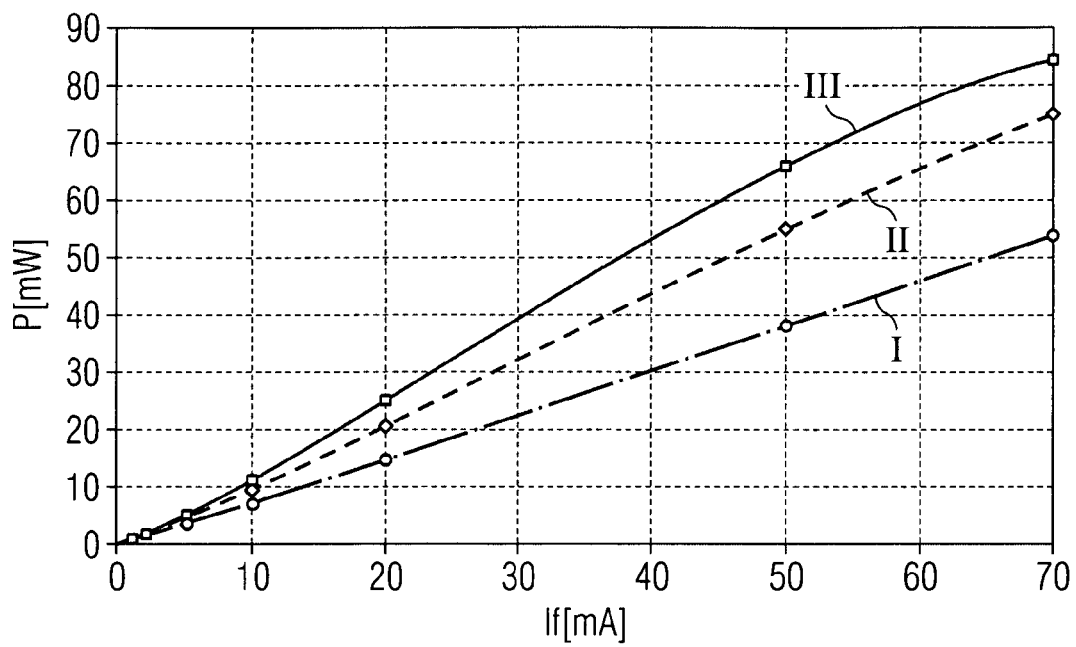
FIG. 3 shows a graph illustrating current-power characteristic curves of two LED semiconductor bodies according to the invention which emit in the visible range.

FIG. 3 illustrates characteristic curves I, II and III of a first, second and third LED semiconductor body. The semiconductor bodies differ from one another in the number of active layers. The first semiconductor body, having the characteristic curve I, comprises one active layer. The second semiconductor body, having the characteristic curve II, comprises two active layers between which a tunnel junction is arranged. The third semiconductor body, having the characteristic curve III, comprises three active layers, in each case a tunnel junction being arranged between two active layers.

The semiconductor bodies contain InGaAlP and emit radiation in the visible range, preferably with a wavelength λ=630 nm.

It emerges from the graph that the radiation power P of the semiconductor bodies rises as the current intensity If of the supplied current increases. It can furthermore be seen that the third semiconductor body, at least in the range If >10 mA, has a greater radiation power than the first and the second semiconductor body for the same current intensity. Since the semiconductor bodies have an approximately identical size, the radiation density is thus greatest in the case of the third semiconductor body. Furthermore, the radiation density of the second semiconductor body is greater than the radiation density of the first semiconductor body, which serves as a reference.

Figure 4:
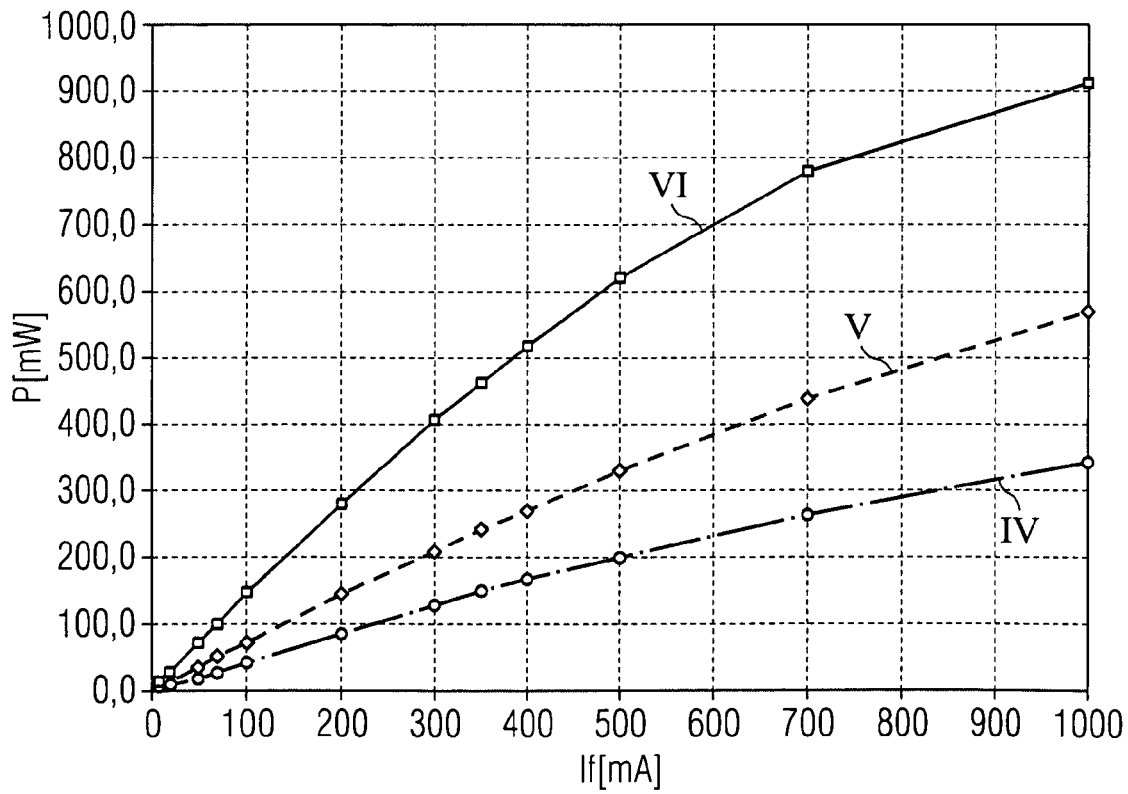
FIG. 4 shows a graph illustrating current-power characteristic curves of two LED semiconductor bodies according to the invention which emit in the infrared range.

FIG. 4 illustrates characteristic curves IV, V and VI of a first, second and third LED semiconductor body. The semiconductor bodies differ from one another in the number of active layers. The first semiconductor body, having the characteristic curve IV, comprises one active layer. The second semiconductor body, having the characteristic curve V, comprises two active layers between which a tunnel junction is arranged. The third semiconductor body, having the characteristic curve VI, comprises five active layers, in each case a tunnel junction being arranged between two active layers.

The semiconductor bodies emit radiation in the infrared range, in particular with a wavelength λ=950 nm. The active layer preferably comprises a GaAs/AlGaAs heterojunction. The semiconductor bodies are particularly preferably formed as thin-film semiconductor bodies. Furthermore, the semiconductor bodies are high-current semiconductor bodies.

In a manner corresponding to FIG. 3, it emerges from the graph illustrated in FIG. 4 that the radiation power P of the semiconductor bodies rises as the current intensity If of the supplied current increases. It can furthermore be seen that the third semiconductor body, at least in the range If>50 mA, has a greater radiation power than the first and the second semiconductor body for the same current intensity. Since the semiconductor bodies have an approximately identical size, the radiation density is thus greatest in the case of the third semiconductor body. Furthermore, the radiation density of the second semiconductor body is greater than the radiation density of the first semiconductor body.

The invention is not restricted by the description on the basis of the exemplary embodiments. In particular, in the context of the invention, it is possible to arrange not only two active radiation-generating layers but also three, four or more radiation-generating layers vertically one above another, which are preferably electrically connected to one another in each case by means of a tunnel junction or a connecting layer.

Furthermore, the invention encompasses any new feature and also any combination of features, in particular any combination of features in the patent claims, even if these features or this combination of features are themselves or is itself not explicitly specified in the patent claims or exemplary embodiments.

The invention claimed is:

1. An LED semiconductor body comprising a first radiation-generating active layer and a second radiation-generating active layer, the first active layer and the second active layer being arranged one above another in a vertical direction and monolithically integrated in the semiconductor body;
   wherein the first and the second active layers generate radiation having an equal wavelength.

2. The LED semiconductor body according to claim 1, wherein the first and the second active layer in each case generate incoherent radiation.

3. The LED semiconductor body according to claim 1, further comprising a tunnel junction formed between the first and the second active layer.

4. The LED semiconductor body according to claim 3, wherein the tunnel junction is formed by means of a highly doped layer of a first conductivity type and a highly doped layer of a second conductivity type.

5. The LED semiconductor body according to claim 1, further comprising:
   a connecting layer of a first conductivity type arranged between the first and the second active layer, and
   a layer of a second conductivity type in each case arranged on that side of the first and of the second active layer which is remote from the connecting layer.

6. The LED semiconductor body according to claim 5, wherein the connecting layer is electrically connectable by means of a contact.

7. The LED semiconductor body according to claim 5, wherein the outer layers of the second conductivity type is electrically connected by means of an external contact-connection.

8. The LED semiconductor body according to claim 1, wherein the LED semiconductor body is arranged on a carrier element.

9. The LED semiconductor body according to claim 8, wherein the carrier element is electrically conductive and/or transmissive to the radiation generated.

10. The LED semiconductor body according to claim 8, further comprising a rear side contact arranged on a side of the carrier element which is remote from the LED semiconductor body.

11. The LED semiconductor body according to claim 8, wherein the LED semiconductor body is grown on the carrier element.

12. The LED semiconductor body according to claim 8, wherein the LED semiconductor body is grown on a growth substrate that is different from the carrier element.

13. The LED semiconductor body according to claim 12, wherein the growth substrate being removed from the semiconductor body.

14. The LED semiconductor body according to claim 1, wherein the semiconductor body includes InGaAlAs or InGaAlP.

15. The LED semiconductor body according to claim 1, wherein the semiconductor body includes InGaAlN.

16. The LED semiconductor body according to claim 1, wherein the semiconductor body emits radiation in the vertical direction.

17. The LED semiconductor body of claim 14, wherein the InGaAlAs or InGaAlP is included in at least one of the two active layers.

18. The LED semiconductor body of claim 15, wherein the InGaAlN is included in at least one of the two active layers.

19. The LED semiconductor body of claim 1, wherein the LED semiconductor body is free of a bonding material between the first active layer and the second active layer.

20. The LED semiconductor body of claim 1, wherein the first active layer and the second active layer are connected by at least one semiconductor layer.

21. An LED semiconductor body comprising:
   a first radiation-generating active layer,
   a second radiation-generating active layer,
   a connecting layer of a first conductivity type arranged between the first and second active layers, and
   a layer of a second conductivity type arranged on a side of each of the first and second active layers which is remote from the connecting layer,
   wherein the first active layer and the second active layer are arranged one above another in a vertical direction and monolithically integrated in the semiconductor body, and
   wherein the first active layer and the second active layer generate radiation having an equal wavelength.

* * * * *